(12) United States Patent
Umetsu et al.

(10) Patent No.: US 9,963,339 B2
(45) Date of Patent: May 8, 2018

(54) SENSOR DEVICE

(71) Applicant: Alps Electric Co., Ltd., Ota-ku, Tokyo (JP)

(72) Inventors: Eiji Umetsu, Niigata-ken (JP); Hisanobu Okawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days. days.

(21) Appl. No.: 15/452,405

(22) Filed: Mar. 7, 2017

(65) Prior Publication Data
US 2017/0291812 A1 Oct. 12, 2017

(30) Foreign Application Priority Data
Apr. 8, 2016 (JP) .................. 2016-078142

(51) Int. Cl.
*B81B 3/00* (2006.01)
*B81B 7/00* (2006.01)
*G01D 5/24* (2006.01)
*G01D 5/16* (2006.01)

(52) U.S. Cl.
CPC ............ *B81B 3/0021* (2013.01); *B81B 3/00* (2013.01); *B81B 3/0018* (2013.01); *B81B 3/0067* (2013.01); *B81B 7/007* (2013.01); *B81B 7/0016* (2013.01); *B81B 7/0058* (2013.01); *B81B 2201/0264* (2013.01); *B81B 2203/0127* (2013.01); *G01D 5/16* (2013.01); *G01D 5/24* (2013.01)

(58) Field of Classification Search
CPC ....... B81B 3/00; B81B 3/0018; B81B 3/0021; B81B 3/0067; B81B 7/0006; B81B 7/0032; B81B 7/0058; B81B 7/007
See application file for complete search history.

(56) References Cited

U.S. PATENT DOCUMENTS

| 4,922,756 | A | * | 5/1990 | Henrion | F16F 15/073 73/514.18 |
|---|---|---|---|---|---|
| 5,203,208 | A | * | 4/1993 | Bernstein | G01C 19/5719 73/504.12 |
| 5,209,117 | A | * | 5/1993 | Bennett | G01P 15/0802 324/658 |
| 5,243,861 | A | * | 9/1993 | Kloeck | B81B 7/007 257/415 |
| 5,487,305 | A | * | 1/1996 | Ristic | G01P 15/125 73/514.18 |
| 5,777,227 | A | * | 7/1998 | Cho | G01P 15/0802 73/514.01 |
| 6,122,965 | A | * | 9/2000 | Seidel | G01P 15/18 73/514.32 |

(Continued)

*Primary Examiner* — Eduardo A Rodela
(74) *Attorney, Agent, or Firm* — Beyer Law Group LLP

(57) ABSTRACT

A sensor device includes: a sensor portion having a movable thin film and a detection element configured to output a signal corresponding to displacement of the movable thin film; a frame portion disposed to surround an outside of the sensor portion; a spring portion provided between the frame portion and the sensor portion; and a circuit board including a circuit configured to process the signal output from the detection element, in which the frame portion is laminated on the circuit board, and the sensor portion is cantilevered from the frame portion by the spring portion such that a gap is formed between the sensor portion and the circuit board.

7 Claims, 20 Drawing Sheets

(56) References Cited

U.S. PATENT DOCUMENTS

| | | | |
|---|---|---|---|
| 6,750,521 B1 * | 6/2004 | Chilcott | B81B 7/007 |
| | | | 257/414 |
| 9,233,834 B2 | 1/2016 | Faralli et al. | |
| 2003/0209075 A1 * | 11/2003 | Okada | B81B 3/0062 |
| | | | 73/514.16 |
| 2012/0060605 A1 * | 3/2012 | Wu | G01L 9/0073 |
| | | | 73/514.11 |
| 2013/0214365 A1 * | 8/2013 | Schlarmann | G01L 9/0042 |
| | | | 257/415 |
| 2014/0183669 A1 * | 7/2014 | Xu | G01C 19/5656 |
| | | | 257/415 |
| 2015/0122038 A1 | 5/2015 | Mayer et al. | |
| 2016/0096724 A1 * | 4/2016 | Dawson | B81B 7/0048 |
| | | | 257/418 |

* cited by examiner (LAYOUT A)

(LAYOUT A: X-DIRECTION FIXING)

(LAYOUT A: Y-DIRECTION FIXING)

(LAYOUT B: X-DIRECTION FIXING)

(LAYOUT B: Y-DIRECTION FIXING)

(LAYOUT C: X-DIRECTION FIXING)

(LAYOUT C: Y-DIRECTION FIXING)

(LAYOUT D: X-DIRECTION FIXING)

(LAYOUT D: Y-DIRECTION FIXING)

(LAYOUT E: X-DIRECTION FIXING)

(LAYOUT E: Y-DIRECTION FIXING)

(LAYOUT A)

(LAYOUT F)

SENSOR DEVICE

CLAIM OF PRIORITY

This application claims benefit of Japanese Patent Application No. 2016-078142 filed on Apr. 8, 2016, which is hereby incorporated by reference.

BACKGROUND OF THE INVENTION

1. Field of the Invention

The present invention relates to a sensor device, and more particularly to a sensor device including a detection element that outputs a signal corresponding to the displacement of a movable thin film.

2. Description of the Related Art

A sensor device in which a movable thin film is formed on a semiconductor substrate or the like by using a microelectromechanical systems (MEMS) technology and the displacement of the movable thin film is detected by a detection element is used in various fields as a small and highly accurate device.

The movable thin film is formed, for example, by etching a semiconductor material such as silicon to form a cavity, and causing a thin silicon film to remain on the cavity. Accurately detecting the displacement of this movable thin film is an important factor for determining the detection accuracy of the sensor device.

The specification of U.S. Pat. No. 9,233,834 discloses a configuration in which a region where a diaphragm is formed is supported by a plurality of springs. In the configuration supported by such springs, stress applied to the diaphragm can be absorbed by the springs.

However, in the configuration in which a sensor portion including a movable thin film such as the diaphragm is supported by the springs, although stress applied to the movable thin film is easily absorbed, in a case where an impact is applied to the sensor portion, the sensor portion moves more than necessary. Therefore, it is difficult to increase impact resistance.

SUMMARY OF THE INVENTION

The present invention provides a sensor device which supports a movable thin film without applying unnecessary stress thereto and has excellent impact resistance.

In order to solve the problems, a sensor device according to an aspect of the present invention includes: a sensor portion having a movable thin film and a detection element configured to output a signal corresponding to displacement of the movable thin film; a frame portion disposed to surround an outside of the sensor portion; a spring portion provided between the frame portion and the sensor portion; and a circuit board including a circuit configured to process the signal output from the detection element, in which the frame portion is provided on the circuit board, and the sensor portion is cantilevered from the frame portion by the spring portion such that a gap is formed between the sensor portion and the circuit board.

In this configuration, since the sensor portion is cantilevered from the frame portion by the spring portion, the sensor portion is disposed in a cavity without receiving unnecessary stress from the frame portion. In addition, even when the sensor portion cantilevered by the spring portion is displaced, since a collision between the sensor portion and the circuit board can be prevented by the gap formed between the sensor portion and the circuit board, impact resistance can be enhanced with a small size.

In the sensor device according to the aspect of the present invention, an outer shape of the sensor portion in a plan view may have at least two sides and a connection portion provided between two adjacent sides of the at least two sides, and one end of the spring portion may be connected to the connection portion. Accordingly, stress transmitted from the cantilevered spring portion to the sensor portion can be effectively suppressed.

In the sensor device according to the aspect of the present invention, the outer shape of the movable thin film in the plan view may be a rectangular shape, and the spring portion may be provided on an extension of a diagonal line of the movable thin film. In addition, the detection element may be disposed at a center portion of a side of the movable thin film. The detection element may be a piezoresistive element or a capacitive element. Accordingly, the sensor portion can be supported at a point distant from the position of the movable thin film with the largest displacement, and the influence of erroneous detection on the detection element by the stress transmitted from the frame portion to the sensor portion can be effectively suppressed.

The sensor device according to the aspect of the present invention may further include: a metal sealing portion provided between the circuit board and the frame portion; and a pad portion provided between the circuit board and the frame portion on an inside of the metal sealing portion to obtain electrical connection between the detection element and the circuit board. Accordingly, the sealing performance for the cavity space on the inside of the frame portion is enhanced, and reliable electrical connection between the detection element and the circuit board is obtained.

The sensor device according to the aspect of the present invention may further include a lid portion provided on a side of the frame portion opposite to the circuit board, in which a gap may be formed between the sensor portion and the lid portion. Accordingly, the sensor portion can be disposed in the cavity space provided between the lid portion and the circuit board without interrupting the displacement of the sensor portion which is cantilevered.

According to the aspect of the present invention, it is possible to provide the sensor device which supports the movable thin film without applying unnecessary stress thereto and has excellent impact resistance.

DESCRIPTION OF THE PREFERRED EMBODIMENTS

Figure 1A:
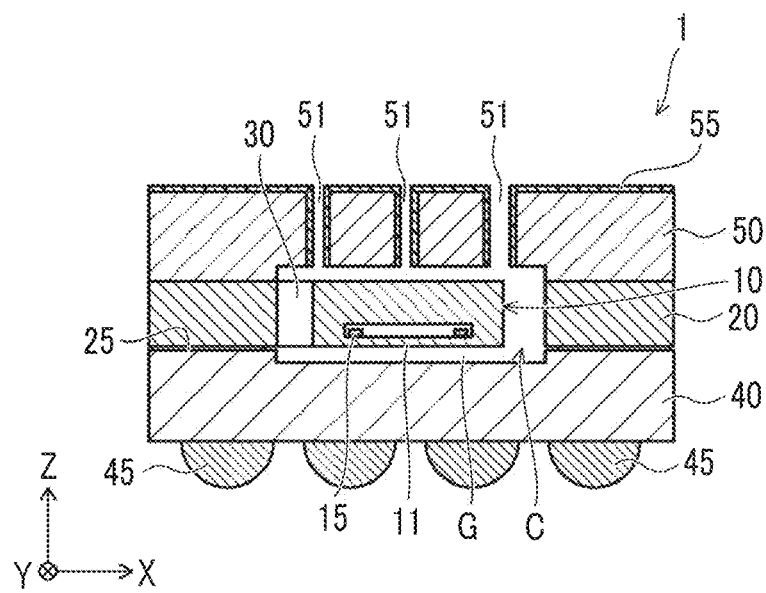
FIGS. 1A and 1B are schematic diagrams illustrating a sensor device according to an embodiment.

Hereinafter, an embodiment of the present invention will be described with reference to the drawings. In the following description, like elements are denoted by like reference numerals, and description of members once described is appropriately omitted.

Configuration of Sensor Device

Figure 1B:
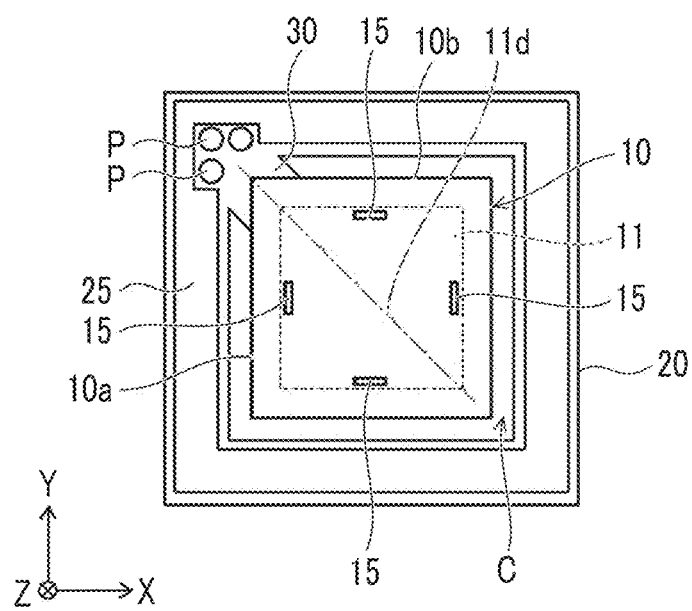

FIGS. 1A and 1B are schematic diagrams illustrating a sensor device according to the embodiment.

FIG. 1A shows a cross-sectional view of a sensor device 1, and FIG. 1B shows a rear view of a sensor portion 10.

The sensor device 1 according to the embodiment includes a sensor portion 10 having a movable thin film 11 and a detection element 15 that outputs a signal corresponding to the displacement of the movable thin film 11. The detection element 15 of the sensor portion 10 is, for example, a piezoresistive element or a capacitive element. Accordingly, various physical quantities such as pressure, acceleration, temperature, humidity, and sound pressure are detected. In the embodiment, the sensor portion 10 is configured to detect pressure as an example.

The sensor device 1 includes a frame portion 20 disposed so as to surround the outside of the sensor portion 10, a spring portion 30 provided between the frame portion 20 and the sensor portion 10, and a circuit board 40 including a circuit which processes a signal output from the detection element 15.

In the sensor device 1, the frame portion 20 is provided on the circuit board 40. In addition, the sensor portion 10 is cantilevered from the frame portion 20 by the spring portion 30. At this time, a gap G is formed between the sensor portion 10 and the circuit board 40 as a relief portion for preventing a collision with the circuit board even in a case where the sensor portion is displaced. In the embodiment, for convenience of description, it is assumed that a direction in which the frame portion 20 and the circuit board 40 are laminated is a Z direction, one of the directions orthogonal to the Z direction is an X direction, and the direction orthogonal to the Z direction and the X direction is a Y direction. A direction from the circuit board 40 toward the frame portion 20 in the Z direction is referred to as upward, a relatively upper side is referred to as a surface side, a direction from the frame portion 20 toward the circuit board 40 is referred to as downward, and a relatively lower side is referred to as a rear surface side.

The circuit board 40 is, for example, an application-specific integrated circuit (ASIC), has a circuit formed by a semiconductor process using a semiconductor wafer, and is formed in a chip shape by dicing. On the rear surface of the circuit board 40, bump electrodes 45 which are electrically connected to the circuit are provided.

The frame portion 20 is laminated on the circuit board 40 via a metal sealing portion 25. The metal sealing portion 25 is annularly provided along the frame portion 20. As the metal sealing portion 25, for example, Au, Au—Sn, or Al—Ge is used. As the annular metal sealing portion 25 is provided on the contact surface between the frame portion 20 and the circuit board 40, sealing properties are enhanced.

The outer shape of the frame portion 20 in a plan view is, for example, a rectangular shape. Furthermore, the outer shape of a cavity C provided on the inside of the frame portion 20 in the plan view is also a rectangular shape, for example. In the embodiment, the rectangular shape includes cases where slight roundness or minute edges are formed at the corners during manufacturing. For example, silicon is used for the frame portion 20. The sensor portion 10 is disposed in the cavity C which is the inside of the frame portion 20. In the embodiment, the sensor portion 10 is supported by the spring portion 30 cantilevered to the frame portion 20. For example, the spring portion 30 and the sensor portion 10 can be formed integrally with each other by forming the spring portion 30 and the sensor portion 10 of silicon. Details of support by the spring portion 30 will be described later.

A lid portion 50 is provided on the frame portion 20. For the lid portion 50, for example, silicon is used. Through-holes 51 are provided in the lid portion 50. Accordingly, in a state of being covered with the lid portion 50, the pressure in the space of the cavity C is brought to the outside air pressure (for example, the atmospheric pressure) by the through-holes 51. The through-holes 51 are formed by etching, for example, silicon. By using reactive-ion etching (RIE) as the etching, fluorocarbon (for example, C4F8) is formed on the inner wall surfaces of the through-holes 51 by an etching gas. The fluorocarbon can be used as a hydrophobic functional film 55. In addition, by slightly performing RIE on the surface of the lid portion 50, the fluorocarbon functional film 55 may also be formed on the surface.

Here, the lid portion 50 and the sensor portion 10 may also be disposed to form a gap therebetween. Accordingly, the sensor portion can be provided in the cavity space provided between the lid portion and the circuit board without interrupting the displacement of the sensor portion which is cantilevered.

The sensor portion 10 has the movable thin film 11 formed by etching a semiconductor such as silicon. The movable thin film 11 is referred to as, for example, a membrane or diaphragm. The outer shape of the movable thin film 11 in the plan view is, for example, a rectangular shape, which is provided on the slightly inside of the outer shape of the sensor portion 10 in the plan view. The detection element 15 is attached to the movable thin film 11. In the example illustrated in FIGS. 1A and 1B, the detection element 15 is attached to each of the center portions of the four sides of the movable thin film 11.

The movable thin film 11 is distorted by pressure such that an electrical signal corresponding to the distortion transmitted to the detection element 15 is obtained. A bridge circuit is constituted by the four detection elements 15 such that the displacement of the movable thin film 11 can be detected as an electrical signal.

In the sensor device 1 according to the embodiment, the sensor portion 10 is cantilevered from the frame portion 20 by the spring portion 30. In the example illustrated in FIG. 1B, one end of the spring portion 30 is connected the connection portion (for example, the corner where two adjacent sides 10a and 10b intersect each other) provided between two adjacent sides 10a and 10b in the outer shape of the sensor portion 10 in the plan view, and the other end of the spring portion 30 is connected to the frame portion 20. Since the sensor portion 10 is cantilevered by the spring portion 30 as described above, the sensor portion 10 is disposed in the cavity C without receiving unnecessary stress from the frame portion 20. In addition, since the sensor portion 10 is cantilevered from the frame portion 20 by the spring portion 30, impact resistance can be enhanced with a small size.

In the case where the outer shape of the movable thin film 11 in the plan view is a rectangular shape, as illustrated in FIG. 1B, it is preferable that the spring portion 30 is provided on an extension of a diagonal line 11d of the movable thin film 11. The position of the movable thin film 11 with the largest displacement is the center portion of the side of the movable thin film 11. Since the attachment position of the spring portion 30 is distant therefrom, the influence of erroneous detection on the detection element 15 by the stress transmitted from the frame portion 20 to the sensor portion 10 can be effectively suppressed.

Furthermore, the spring portion 30 may also be used as a portion that causes a wire (not illustrated) electrically connected to the detection element 15 of the sensor portion 10 to be routed to the frame portion 20. Pads P may be provided at the tip of the connection end of the spring portion 30 in the frame portion 20. The pads P are provided on the inside of the metal sealing portion 25. As the frame portion 20 is laminated on the circuit board 40, electrical connection between the detection element 15 and the circuit board 40 is achieved via the pads P.

Simulation of Stress

Figure 2A:
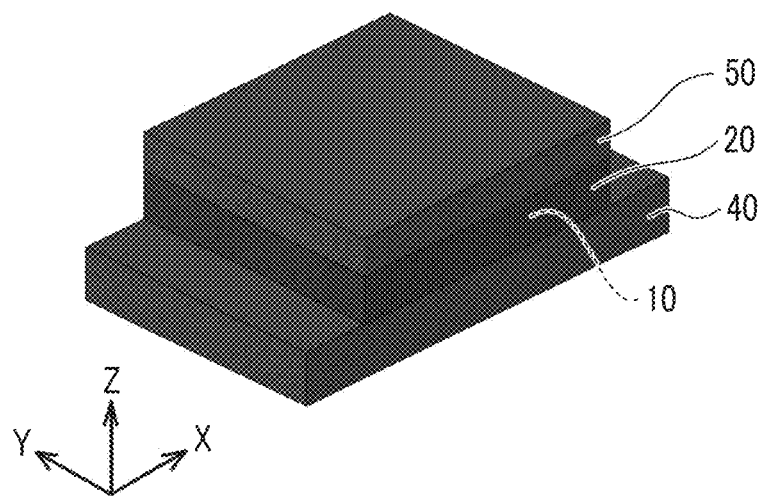
FIGS. 2A to 2B are diagrams illustrating simulation models.

Next, the results of a simulation of stress on the sensor device 1 according to the embodiment will be described. FIGS. 2A to 4B are diagrams illustrating simulation models. As illustrated in FIG. 2A, as a simulation model, a model in which the rectangular frame portion 20 that supports the sensor portion 10 and the lid portion 50 are provided on the circuit board 40 is formed. Five layouts (layouts A to E) were prepared according to the difference in the configuration of the spring portion 30 that supports the sensor portion 10, and a simulation of stress was performed.

Figure 2B:
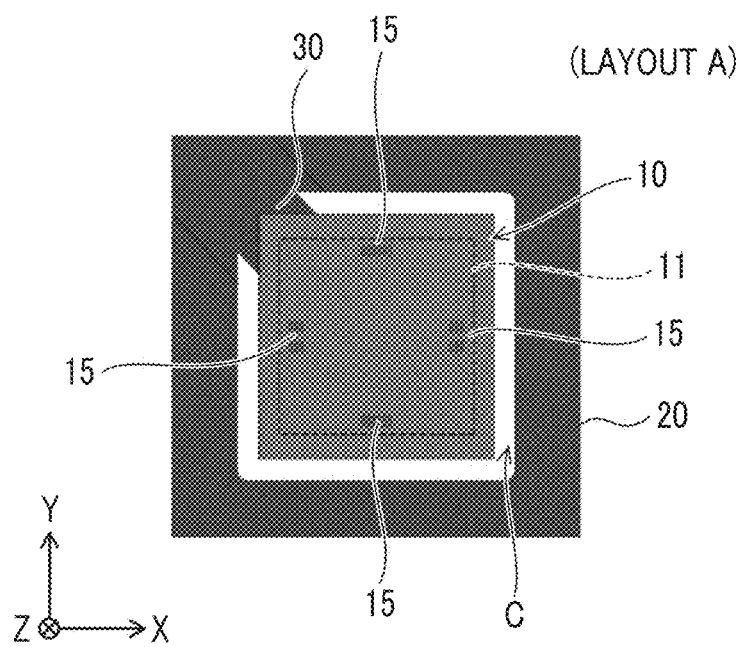
Figure 3A:
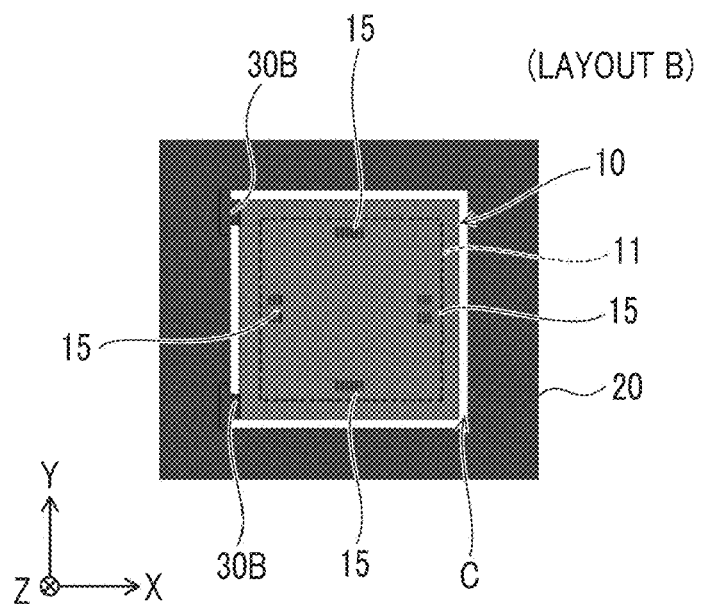
FIGS. 3A to 3B are diagrams illustrating simulation models.
Figure 3B:
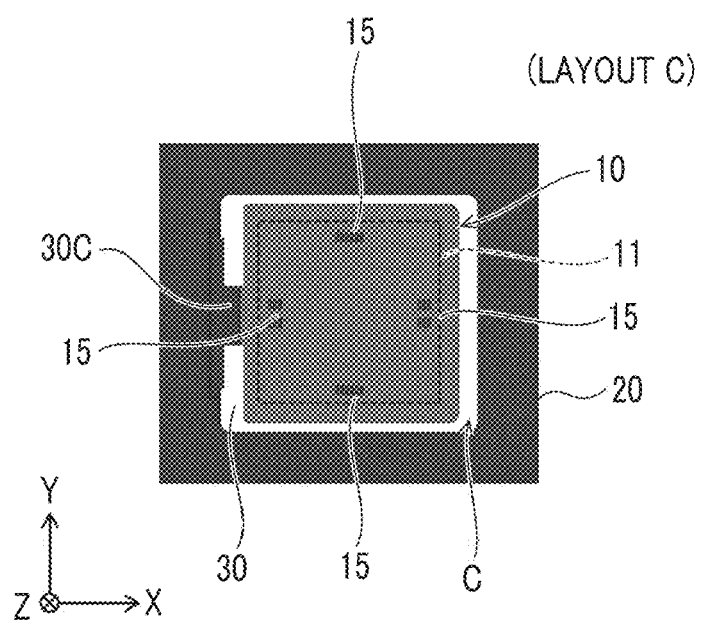
Figure 4A:
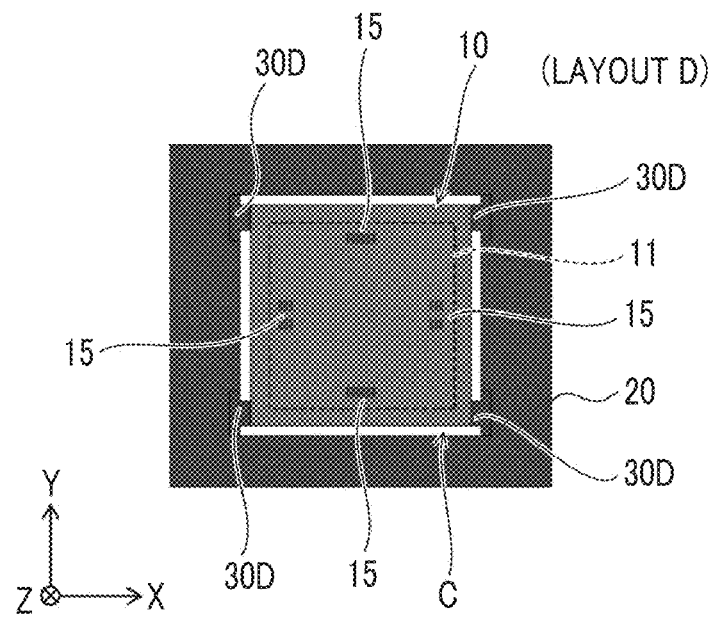
FIGS. 4A to 4B are diagrams illustrating simulation models.
Figure 4B:
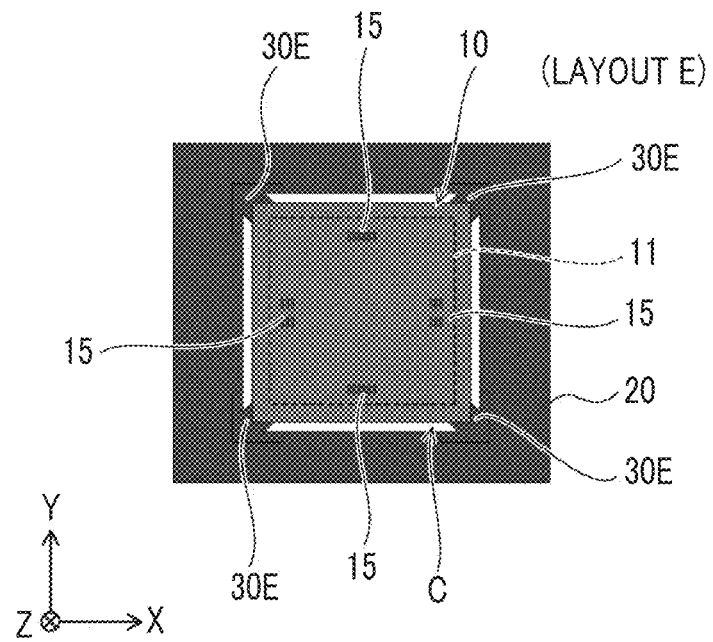

The layout A is shown in FIG. 2B. The layout A is a layout in which the spring portion 30 is connected on the extension of the diagonal line from the connection portion (corner) of the sensor portion 10 as in FIGS. 1A and 1B. FIG. 3A shows the layout B. The layout B is a layout in which two spring portions 30B are connected to both ends of one side of the sensor portion 10. FIG. 3B shows the layout C. The layout C is a layout in which a single spring portion 30C is connected from the center portion of one side of the sensor portion 10. FIG. 4A shows the layout D. The layout D is a layout in which spring portions 30D are connected to both ends of two opposite sides of the sensor portion 10. FIG. 4B shows the layout E. The layout E is a layout in which spring portions 30E are respectively connected to the four corners of the sensor portion 10.

For the layouts A to E, a simulation of stress distributions was performed. Silicon (with a Young's modulus of 178,000 MPa, and a Poisson's ratio of 0.28 (m/m)) was used as the material forming each portion. Regarding the application of a load, there are a case where the sides of the rear surface of the circuit board 40 which are parallel to the X axis are fixed and 100 MPa is applied toward the upper side from the rear surface of the circuit board 40 (X-direction fixing), and a case where the sides of the rear surface of the circuit board 40 which are parallel to the Y axis are fixed and 100 MPa is applied toward the upper side from the rear surface of the circuit board 40 (Y-direction fixing).

Figure 5:
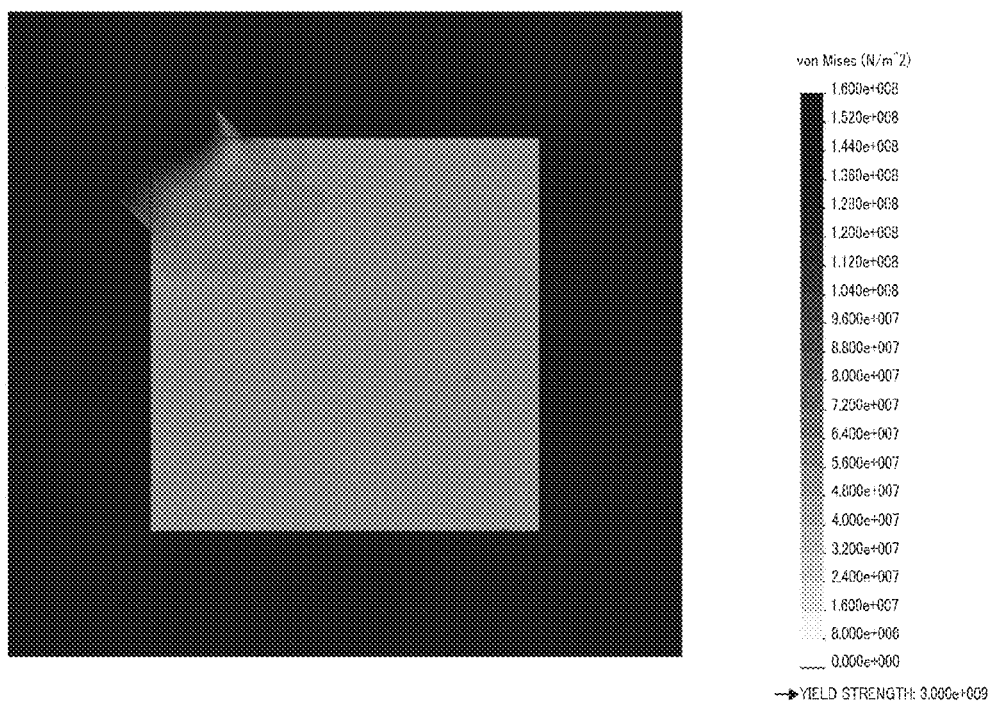
FIG. 5 is a diagram showing the results of a simulation of a stress distribution during X-direction fixing.
Figure 6:
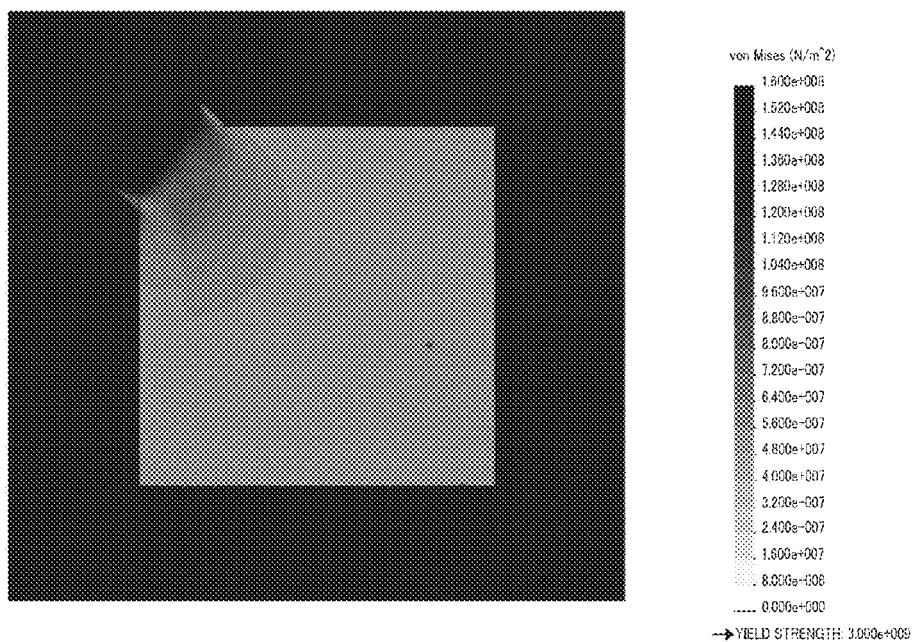
FIG. 6 is a diagram showing the results of a simulation of a stress distribution during Y-direction fixing.
Figure 7:
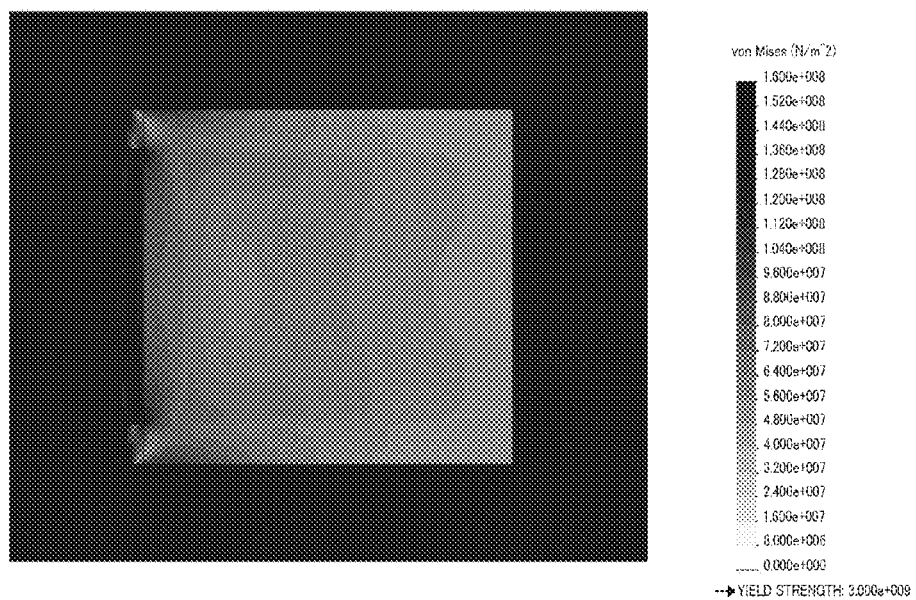
FIG. 7 is a diagram showing the results of a simulation of a stress distribution during X-direction fixing.
Figure 8:
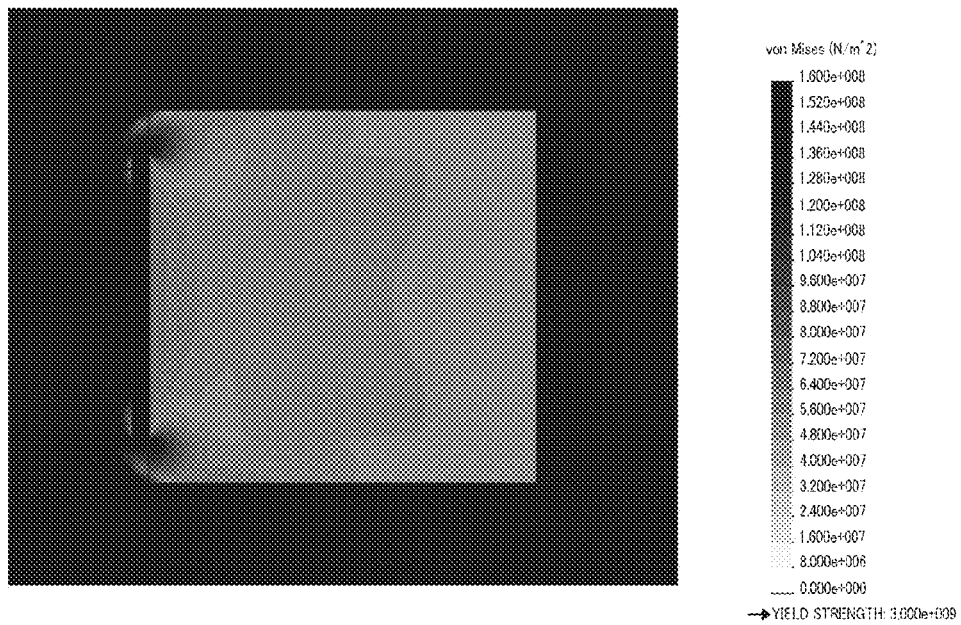
FIG. 8 is a diagram showing the results of a simulation of a stress distribution during Y-direction fixing.
Figure 9:
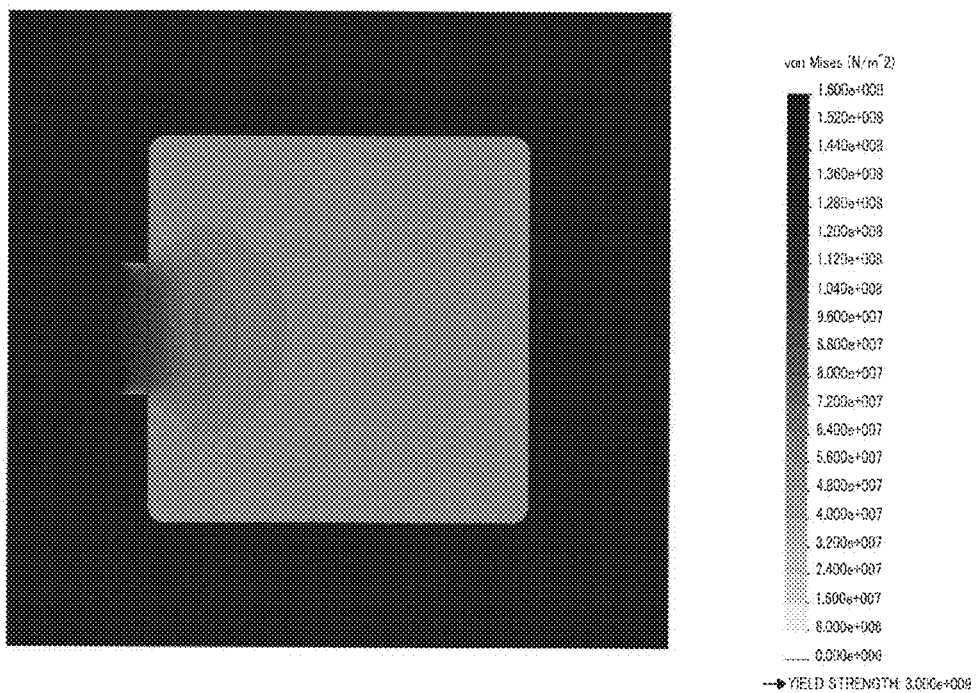
FIG. 9 is a diagram showing the results of a simulation of a stress distribution during X-direction fixing.
Figure 10:
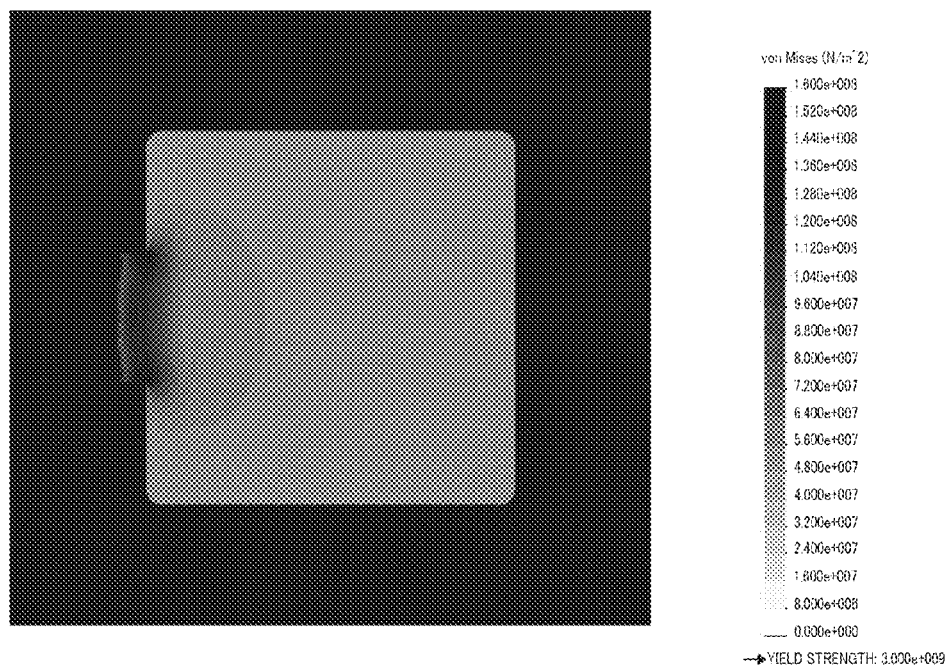
FIG. 10 is a diagram showing the results of a simulation of a stress distribution during Y-direction fixing.
Figure 11:
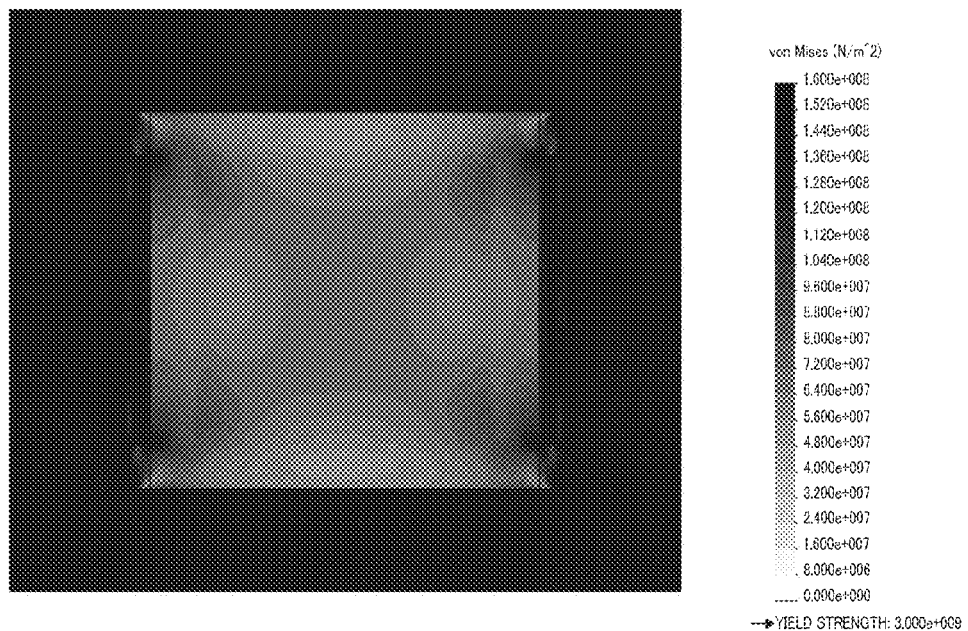
FIG. 11 is a diagram showing the results of a simulation of a stress distribution during X-direction fixing.
Figure 12:
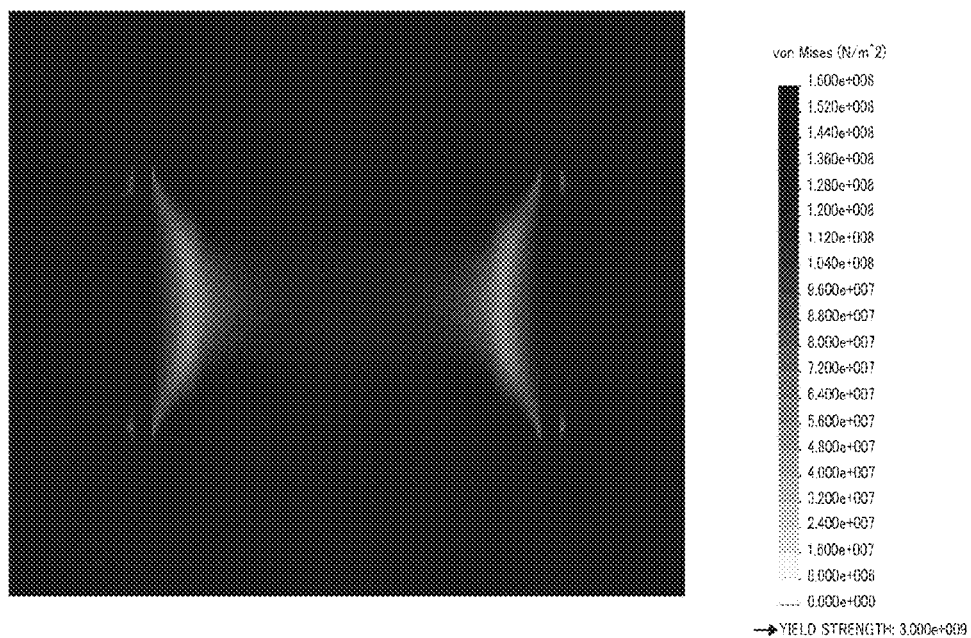
FIG. 12 is a diagram showing the results of a simulation of a stress distribution during Y-direction fixing.
Figure 13:
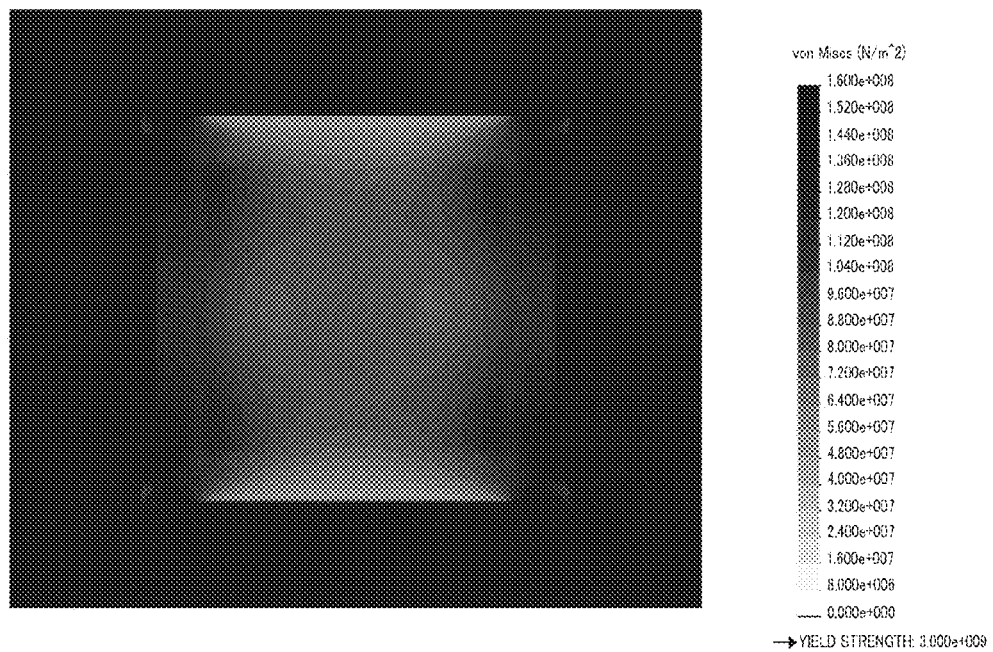
FIG. 13 is a diagram showing the results of a simulation of a stress distribution during X-direction fixing.
Figure 14:
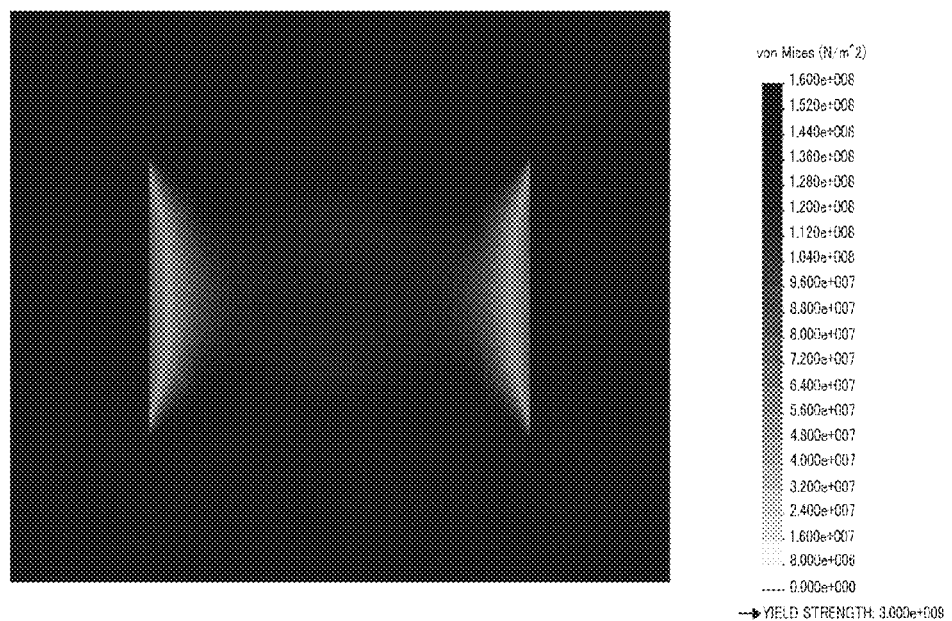
FIG. 14 is a diagram showing the results of a simulation of a stress distribution during Y-direction fixing.

FIGS. 5 to 14 are diagrams showing the results of the simulation of the stress distributions. FIG. 5 shows a stress distribution in the case of the X-direction fixing in the layout A, and FIG. 6 shows a stress distribution in the case of the Y-direction fixing in the layout A. FIG. 7 shows a stress distribution in the case of the X-direction fixing in the layout B, and FIG. 8 shows a stress distribution in the case of the Y-direction fixing in the layout B. FIG. 9 shows a stress distribution in the case of the X-direction fixing in the layout C, and FIG. 10 shows a stress distribution in the case of the Y-direction fixing in the layout C. FIG. 11 shows a stress distribution in the case of the X-direction fixing in the layout D, and FIG. 12 shows a stress distribution in the case of the Y-direction fixing in the layout D. FIG. 13 shows a stress distribution in the case of the X-direction fixing in the layout E, and FIG. 14 shows a stress distribution in the case of the Y-direction fixing in the layout E.

From the results of the simulation of the stress distributions, it can be seen that the influence of the stress applied to the sensor portion 10 is smallest in the layout A. The influence of the stress applied to the sensor portion 10 is second small in the layout C and third smallest in the layout B. It can be seen that the influence of the stress applied to the sensor portion 10 is relatively large in the layouts D and E.

Figure 15:
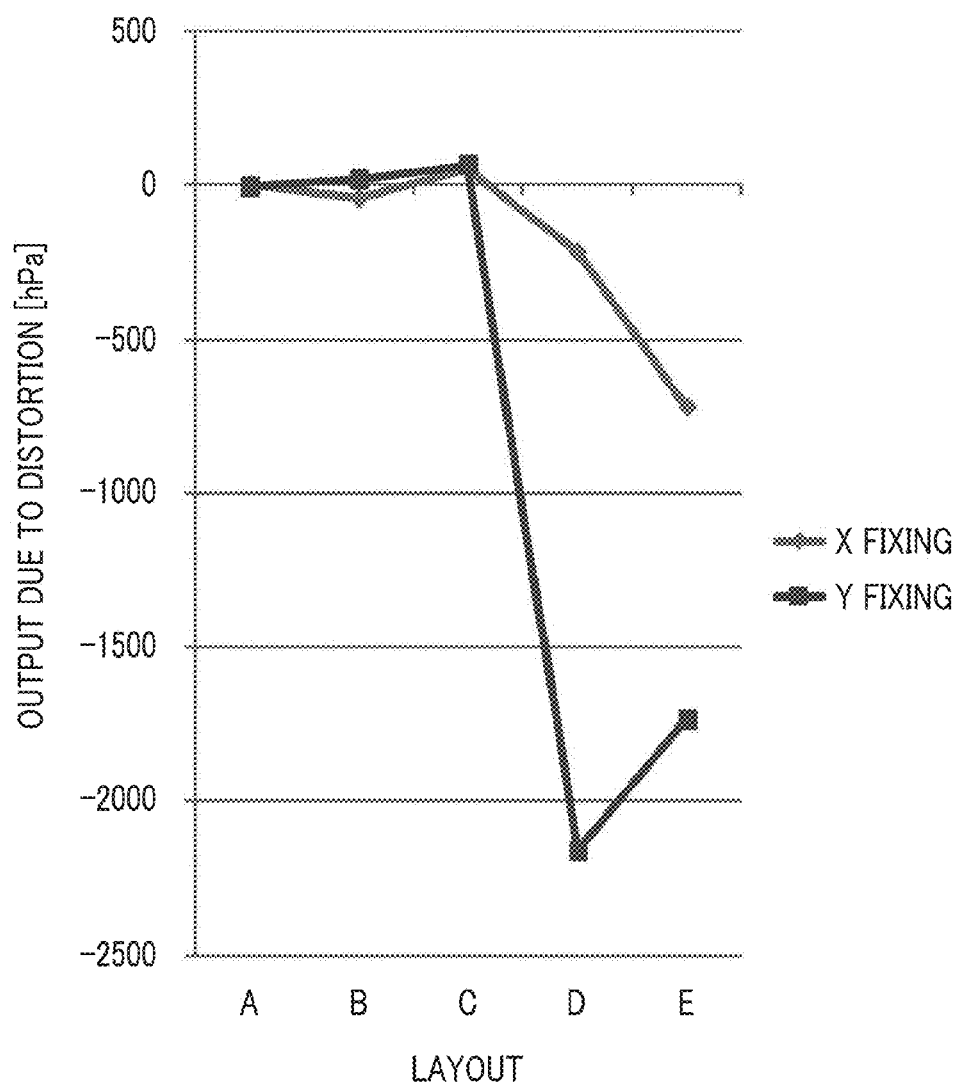
FIG. 15 is a diagram showing the results of a simulation of an output due to distortion.

FIG. 15 is a diagram showing the results of a simulation of an output due to distortion. FIG. 15 shows the output of the detection element 15 due to distortion for each of the layouts A to E. The detection element 15 is a piezoresistive element. The output value is a value obtained by converting the output due to a change in the resistance of the piezoresistive element into pressure when a load during each of the X-direction fixing and the Y-direction fixing is applied.

It is thought that the results of the simulation of the output due to distortion shown in FIG. 15 represent the magnitude of detection error in the detection element 15. It can be seen that the layouts A, B, and C have the smallest detection errors, and the layouts D and E have relatively large detection errors.

Simulation of Impact Resistance

Next, the results of a simulation of the impact resistance of the sensor device 1 according to the embodiment will be described.

Figure 16A:
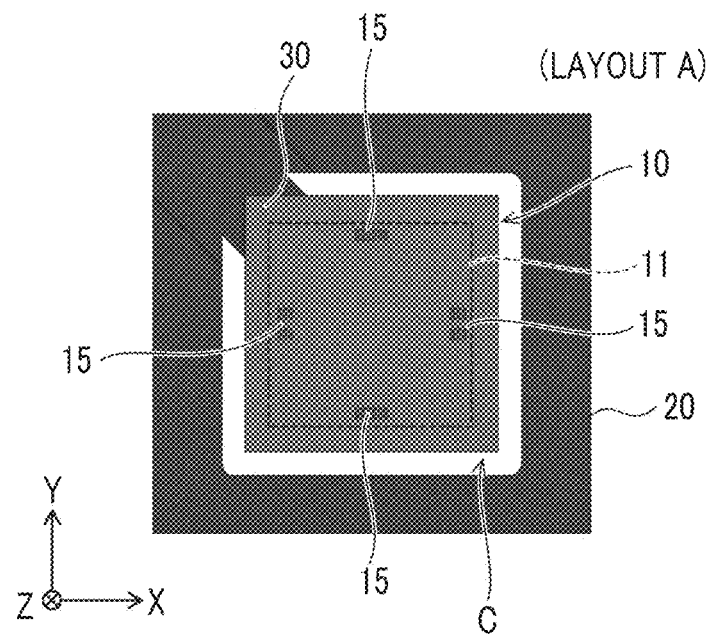
FIGS. 16A and 16B are diagrams showing simulation models.
Figure 16B:
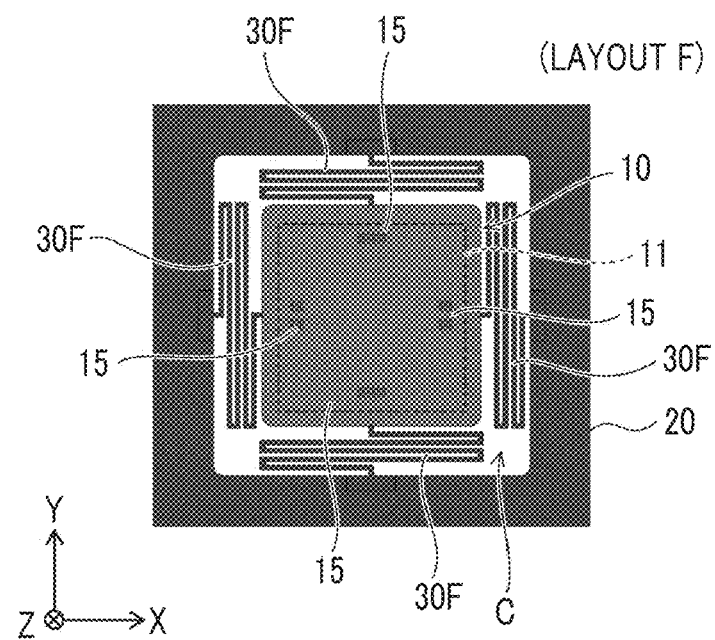

FIGS. 16A and 16B are diagrams showing simulation models. FIG. 16A shows a layout (corresponding to the layout A) of the sensor device according to the embodiment.

The layout A is a layout in which the spring portion 30 is connected on the extension of the diagonal line from the connection portion (corner) of the sensor portion 10. FIG. 16B shows a layout (layout F) of a sensor device according to a comparative example. The layout F is a layout in which spring portions 30F are respectively connected to the four sides of the sensor portion 10. A simulation is performed by setting the spring portion 30F to the same distortion resistance as that of the spring portion 30 of the layout A.

Regarding the layouts A and F, a simulation of impact resistance was performed. Silicon (with a Young's modulus of 178,000 MPa, and a Poisson's ratio of 0.28 (m/m)) was used as the material forming each portion. Regarding the application of a load, there are a case where the rear surface of the circuit board 40 is fixed and 10 kG is applied in the X direction (X-direction displacement), a case where the rear surface of the circuit board 40 is fixed and 10 kG is applied in the Z direction (Z-direction displacement), and a case where the rear surface of the circuit board 40 is fixed and 10 kG is applied in the XY direction (XY-direction displacement).

Figure 17:
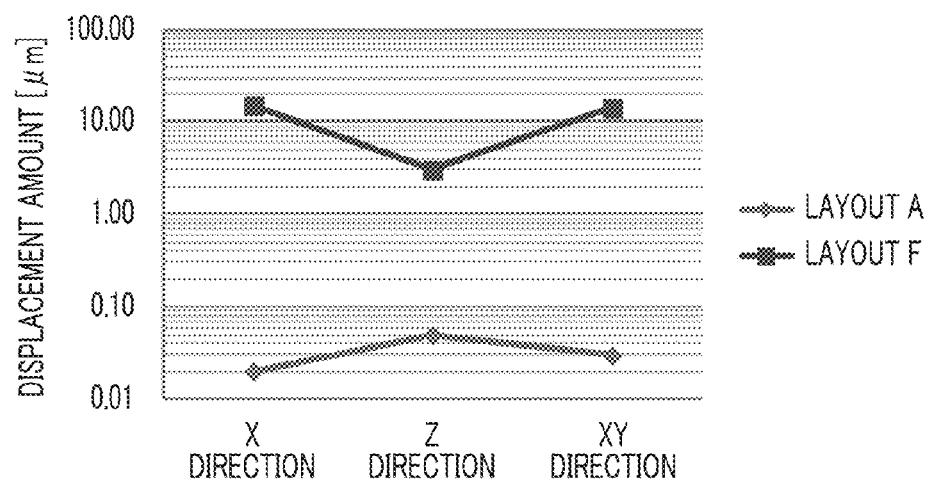
FIG. 17 is a diagram showing the results of a simulation of impact resistance.
Figure 18:
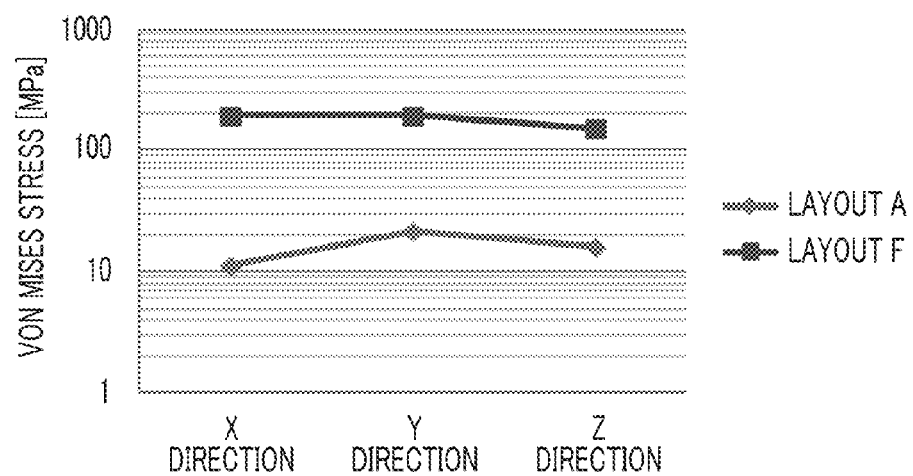
FIG. 18 is a diagram showing the results of a simulation of impact resistance.
Figure 19:
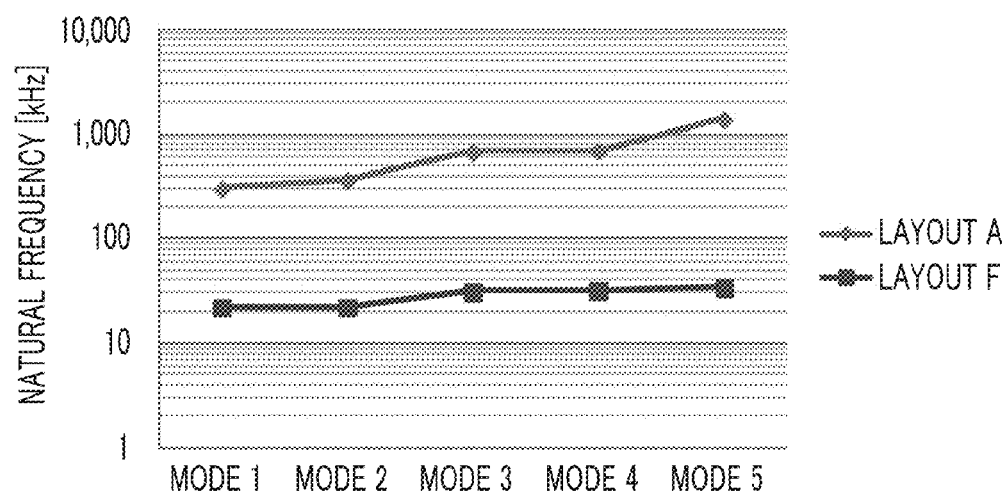
FIG. 19 is a diagram showing the results of a simulation of impact resistance.

FIGS. 17 to 19 are diagrams showing the results of a simulation of impact resistance. FIG. 17 shows the displacement amounts in the layouts A and F. FIG. 18 shows the von Mises stresses in the layouts A and F. As shown in FIGS. 17 and 18, the layout A is a difference of two orders of magnitude in the displacement amount from the layout F, and has a difference of one order of magnitude in the stress maximum value therefrom. It can be seen that the layout A has excellent impact resistance compared to the layout F.

FIG. 19 shows the natural frequencies (modes 1 to 5) in the layouts A and F. The mode 1 refers to a mode regarding the layout A in which the sensor portion 10 moves up and down, and a mode regarding the layout F in which the spring portion 30F vibrates. The mode 2 is a mode regarding the layout A in which the sensor portion 10 moves right and left, and a phase opposite to the mode regarding the layout F in which the spring portion 30F vibrates. The mode 3 is a mode regarding the layout A in which the sensor portion 10 rotates about the spring portion 30, and a mode regarding the layout F in which the spring portion 30F rotates about the center.

As shown in FIG. 19, it can be seen that in the layout A, the natural frequency is one order of magnitude higher than in the layout F. In addition, the natural frequency in the mode 1 with the lowest order of magnitude in the layout A is about 300 kHz. For example, in a case where the sensor device 1 is subjected to ultrasonic cleaning, the frequency during the ultrasonic cleaning is about 10 kHz to 100 kHz. Therefore, in the layout A, even when ultrasonic cleaning is performed, there is a high possibility of endurance without resonance.

Waterproofing Treatment

Figure 20A:
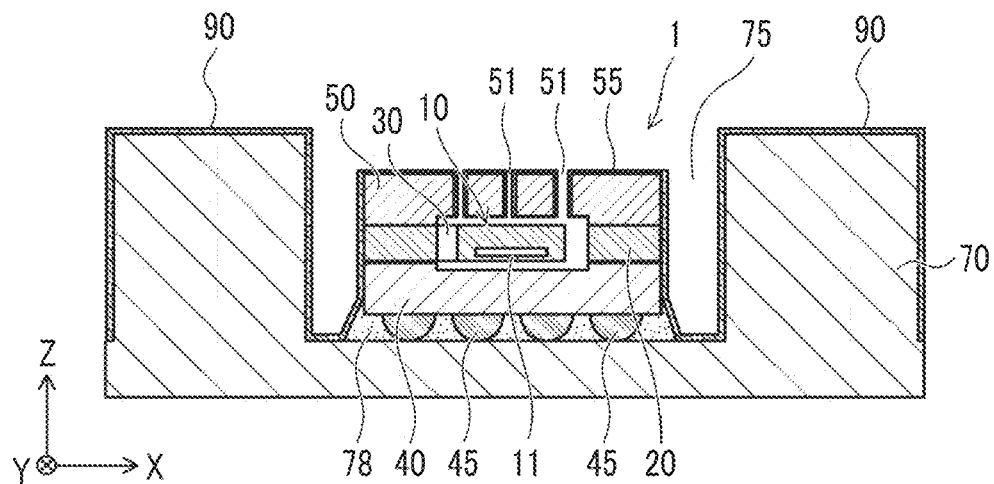
FIGS. 20A and 20B are diagrams showing sectional views of an example of a waterproofing treatment.
Figure 20B:
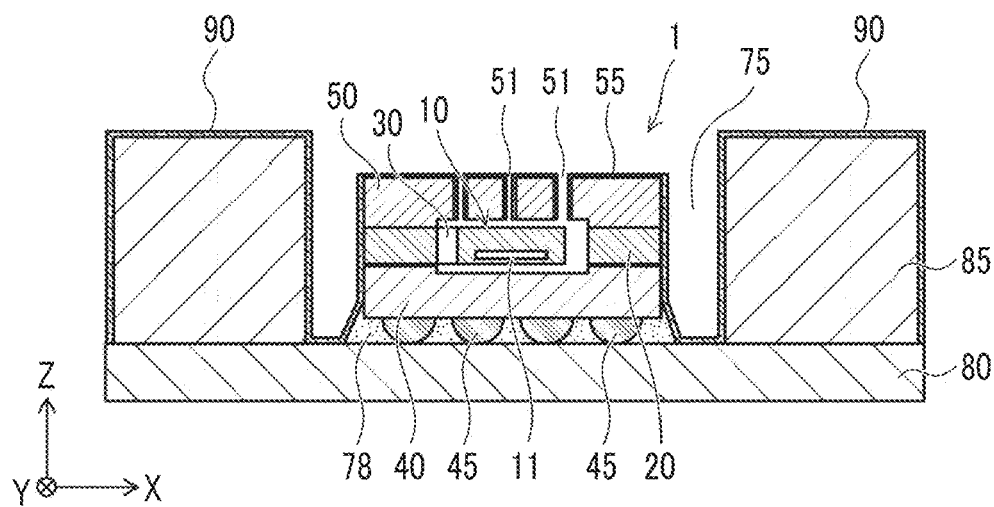

Next, a waterproofing treatment of the sensor device 1 will be described. FIGS. 20A and 20B are sectional views illustrating an example of the waterproofing treatment.

FIG. 20A illustrates an example in which the sensor device 1 is mounted in a cavity housing 70. The cavity housing 70 is provided with a cavity 75 serving as a recess. For example, a silicon substrate is used for the cavity housing 70, and the cavity 75 is provided by etching. The sensor device 1 is soldered to the cavity 75 by the bump electrodes 45. An underfill 78 is provided around the bump electrodes 45.

In a state in which the sensor device 1 is mounted in the cavity 75 of the cavity housing 70, a fluorine-based waterproof coating agent 90 is applied to the surface of the cavity housing 70, the surface of the underfill 78, and the surface of the sensor device 1. After applying the fluorine-based waterproof coating agent 90, the cavity housing 70 is diced or snapped into individual pieces.

FIG. 20B illustrates an example in which a frame section 85 is provided on a flat substrate 80 and the sensor device 1 is mounted therein. The sensor device 1 is soldered to a predetermined position of the flat substrate 80 via the bump electrodes 45. The underfill 78 is provided around the bump electrode 45. After the underfill 78 is provided, the frame section 85 is adhered to the surrounding area of the sensor device 1.

In a state in which the sensor device 1 is mounted on the substrate 80 and the frame section 85 is adhered thereto, the fluorine-based waterproof coating agent 90 is applied to the surface of the substrate 80, the surface of the frame section 85, the surface of the underfill 78, and the surface of the sensor device 1. After applying the fluorine-based waterproof coating agent 90, the substrate 80 and the frame section 85 are diced into individual pieces.

Figure 21:
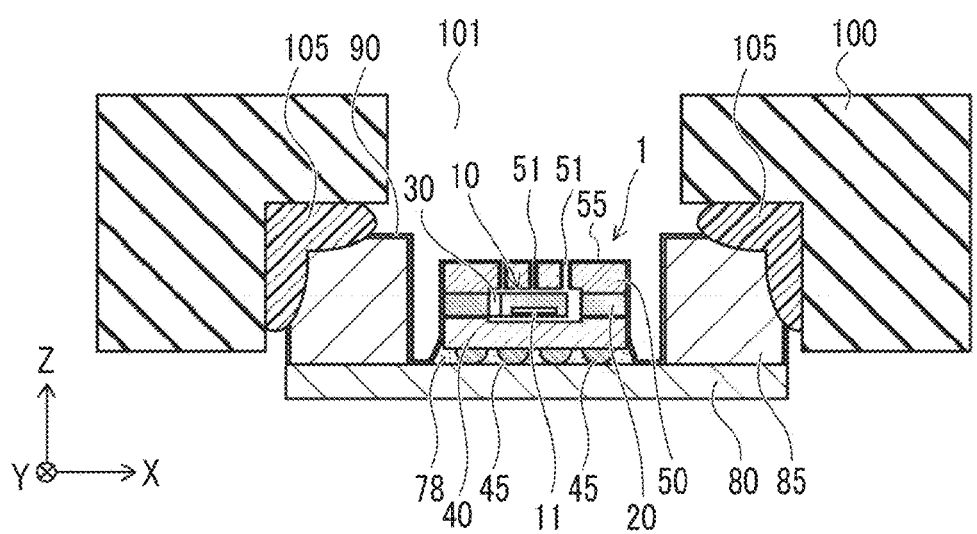
FIG. 21 is a diagram showing a sectional view illustrating a state in which the sensor device is attached to a housing.

FIG. 21 is a sectional view illustrating a state in which the sensor device is attached to a housing. As illustrated in FIGS. 20A and 20B, the sensor device 1 is mounted in the cavity housing 70 or on the substrate 80, and the fluorine-based waterproof coating agent 90 is applied to the surface of each part. In this state, as shown in FIG. 21, the sensor device 1 is attached to a hole 101 of a housing 100. For example, an O-ring 105 is provided between the housing 100 and the sensor device 1. Since the sensor device 1 and the like exposed from the hole 101 are covered with the fluorine-based waterproof coating agent 90, high waterproofness is provided. In addition, infiltration of water into the housing 100 through the hole 101 is prevented by the O-ring 105.

Since the fluorine-based waterproof coating agent 90 described above is applied, the sensor device 1 having excellent water resistance can be provided. In addition, when the functional film 55 is formed on the inner wall surfaces of the through-holes 51 of the lid portion 50, infiltration of water into the cavity C through the through-holes 51 can be prevented.

As described above, according to the embodiment, it is possible to provide the sensor device 1 which supports the movable thin film 11 without applying unnecessary stress thereto and has excellent impact resistance.

Although the embodiment has been described above, the present invention is not limited to this example. For example, the outer shape of the sensor portion 10 or the movable thin film 11 in the plan view may also be a shape other than the rectangular shape. It should be understood by those skilled in the art that various modifications, combinations, sub-combinations and alterations may occur depending on design requirements and other factors insofar as they are within the scope of the appended claims of the equivalents thereof.

What is claimed is:
1. A sensor device comprising:
  a sensor portion including:
    a movable thin film having a rectangular outer shape in a plan view; and
    a detection element attached to the movable thin film, the detection element being configured to output a detection signal corresponding to an amount of displacement of the movable thin film;
  a frame portion surrounding the sensor portion;
  a spring portion provided between the frame portion and the sensor portion, the spring portion being a single cantilever extending from the frame portion so as to support the sensor portion; and
  a circuit board including a circuit configured to process the detection signal from the detection element, wherein the frame portion and the sensor portion are provided on the circuit board such that a first gap is formed between the sensor portion and the circuit board, the spring portion extends along an extension of a diagonal line of the movable thin film, and the movable thin film is disposed within the sensor portion such that an outer periphery of the movable thin film is inside of an outer shape of the sensor portion in the plan view.

2. The sensor device according to claim 1,
wherein an outer shape of the sensor portion in a plan view has at least two sides, a connection portion being provided between two adjacent sides of the at least two sides, and
wherein one end of the spring portion is connected to the connection portion.

3. The sensor device according to claim 1,
wherein the detection element is disposed at a center portion of a side of the movable thin film.

4. The sensor device according to claim 1,
wherein the detection element is a piezoresistive element or a capacitive element.

5. The sensor device according to claim 1, further comprising:
a metal sealing portion provided between the circuit board and the frame portion so as to laminate the frame portion onto the circuit board; and
a pad provided between the circuit board and the frame portion, the pad being disposed in an area inside of the metal sealing portion to provide electrical connection between the detection element and the circuit board.

6. The sensor device according to claim 1, further comprising:
a lid portion provided over the frame portion and the sensor portion on an opposite side of the circuit board,
wherein a second gap is formed between the sensor portion and the lid portion.

7. The sensor device according to claim 1, wherein the frame portion has a cavity within which the sensor portion is disposed such that a corner of the sensor portion corresponding to a corner of the movable thin film is cantilevered by the spring portion, thereby suppressing transmission of stress from the frame portion to the sensor portion.

* * * * *